(12) United States Patent
Mochizuki et al.

(10) Patent No.: US 7,282,839 B2
(45) Date of Patent: Oct. 16, 2007

(54) MULTILAYER PIEZOELECTRIC DEVICE

(75) Inventors: Kazuo Mochizuki, Akita (JP); Syuuzi Itoh, Akita (JP); Hiroshi Hatanaka, Akita (JP)

(73) Assignee: TDK Corporation, Tokyo (JP)

( * ) Notice: Subject to any disclaimer, the term of this patent is extended or adjusted under 35 U.S.C. 154(b) by 85 days.

(21) Appl. No.: 11/252,893

(22) Filed: Oct. 19, 2005

(65) Prior Publication Data
US 2006/0091766 A1    May 4, 2006

(30) Foreign Application Priority Data
Oct. 28, 2004   (JP)   ............................ P2004-314497

(51) Int. Cl.
*H01L 41/047* (2006.01)
*H01L 41/083* (2006.01)

(52) U.S. Cl. ..................................... 310/366

(58) Field of Classification Search ................ 310/328, 310/366
See application file for complete search history.

(56) References Cited

U.S. PATENT DOCUMENTS

| | | | | |
|---|---|---|---|---|
| 4,845,399 A | * | 7/1989 | Yasuda et al. | 310/366 |
| 6,528,927 B1 | * | 3/2003 | Schuh et al. | 310/328 |
| 6,563,687 B2 | * | 5/2003 | Kawazoe et al. | 361/301.4 |
| 6,978,525 B2 | * | 12/2005 | Iwase et al. | 29/25.35 |
| 2006/0043841 A1 | * | 3/2006 | Kadotani et al. | 310/328 |
| 2006/0138908 A1 | * | 6/2006 | Iwase et al. | 310/366 |

FOREIGN PATENT DOCUMENTS

| JP | 92703539 | * 10/1997 |
|---|---|---|
| JP | A-2003-502869 | 1/2003 |
| JP | 2005086110 | * 3/2005 |
| WO | WO 00/79607 A1 | 12/2000 |

* cited by examiner

Primary Examiner—Thomas M. Dougherty
(74) Attorney, Agent, or Firm—Oliff & Berridge, PLC

(57) ABSTRACT

Provided is a multilayer piezoelectric device high in reliability and easy in formation of a unit when incorporated into various devices. In a multilayer piezoelectric device, each second external electrode is integrally formed including a main body part electrically and physically connected to a first external electrode, and an extending part having an upper end projecting with respect to an upper face of laminate in a stack direction. This permits the extending part of the second external electrode to be used as a terminal, and, because the second external electrode is integrally formed, the second external electrode can be prevented from breaking. Therefore, it results in improving the reliability of piezoelectric device. Furthermore, between second external electrodes facing each other, a distance between extending parts is larger than a distance between main body parts, and thus it becomes easy to form a unit of the piezoelectric device when incorporated in various devices; e.g., a plate for application of a preload is placed on the upper face of the laminate.

1 Claim, 2 Drawing Sheets

MULTILAYER PIEZOELECTRIC DEVICE

BACKGROUND OF THE INVENTION

1. Field of the Invention

The present invention relates to a multilayer piezoelectric device.

2. Related Background Art

One of the conventional multilayer piezoelectric devices is a piezoelectric actuator, for example, described in JP-A-2003-502869. This piezoelectric actuator has a laminate consisting of an alternate stack of a plurality of piezoelectric members and a plurality of internal electrodes, first external electrodes provided so as to face respective side faces of the laminate and electrically connected to predetermined internal electrodes, and second external electrodes provided outside the respective first external electrodes and electrically connected to the respective first external electrodes. In this piezoelectric actuator, a connection wire as a terminal is soldered to each second external electrode.

SUMMARY OF THE INVENTION

However, the above-described piezoelectric actuator has the following problems. Namely, since the connection wires as terminals are soldered to the corresponding second external electrodes, the soldered portions between the connection wires and the second external electrodes can break during long-term use of the piezoelectric actuator, posing the problem of insufficient reliability of the piezoelectric actuator. In addition, since a pair of connection wires extend in much the same width as the laminate and in the stack direction of the laminate, it is difficult to form a unit of the piezoelectric actuator when incorporated into various devices.

The present invention has been accomplished in view of the above circumstances, and an object of the invention is to provide a multilayer piezoelectric device high in reliability and easy in formation of a unit when incorporated into various devices.

In order to achieve the above object, a multilayer piezoelectric device according to the present invention is a multilayer piezoelectric device comprising: a laminate consisting of an alternate stack of a plurality of piezoelectric members and a plurality of internal electrodes; first external electrodes which are provided on side faces of the laminate so as to face each other, and each of which is electrically connected to predetermined ones of said internal electrodes; and second external electrodes provided outside the respective first external electrodes, wherein each of the second external electrodes is integrally formed including a main body part electrically and physically connected to the corresponding first external electrode, and an extending part having one end projecting with respect to one end face of the laminate in a stack direction of the laminate, and wherein, between the second external electrodes facing each other, a distance between the extending parts is larger than a distance between the main body parts.

In this multilayer piezoelectric device, the second external electrode is integrally formed including the main body part electrically and physically connected to the first external electrode, and the extending part having one end projecting with respect to one end face of the laminate in the stack direction of the laminate. This permits the extending part of the second external electrode to be used as a terminal, and, since the second external electrode is integrally formed, the second external electrode can be prevented from breaking even in long-term use of the piezoelectric device. Accordingly, the reliability of the piezoelectric device is enhanced. Furthermore, between the second external electrodes facing each other, the distance between the extending parts is larger than the distance between the main body parts, whereby the piezoelectric device can be readily formed in a unit when incorporated into various devices; for example, a plate for application of a preload is placed on one end face of the laminate.

DESCRIPTION OF THE PREFERRED EMBODIMENT

Figure 1:
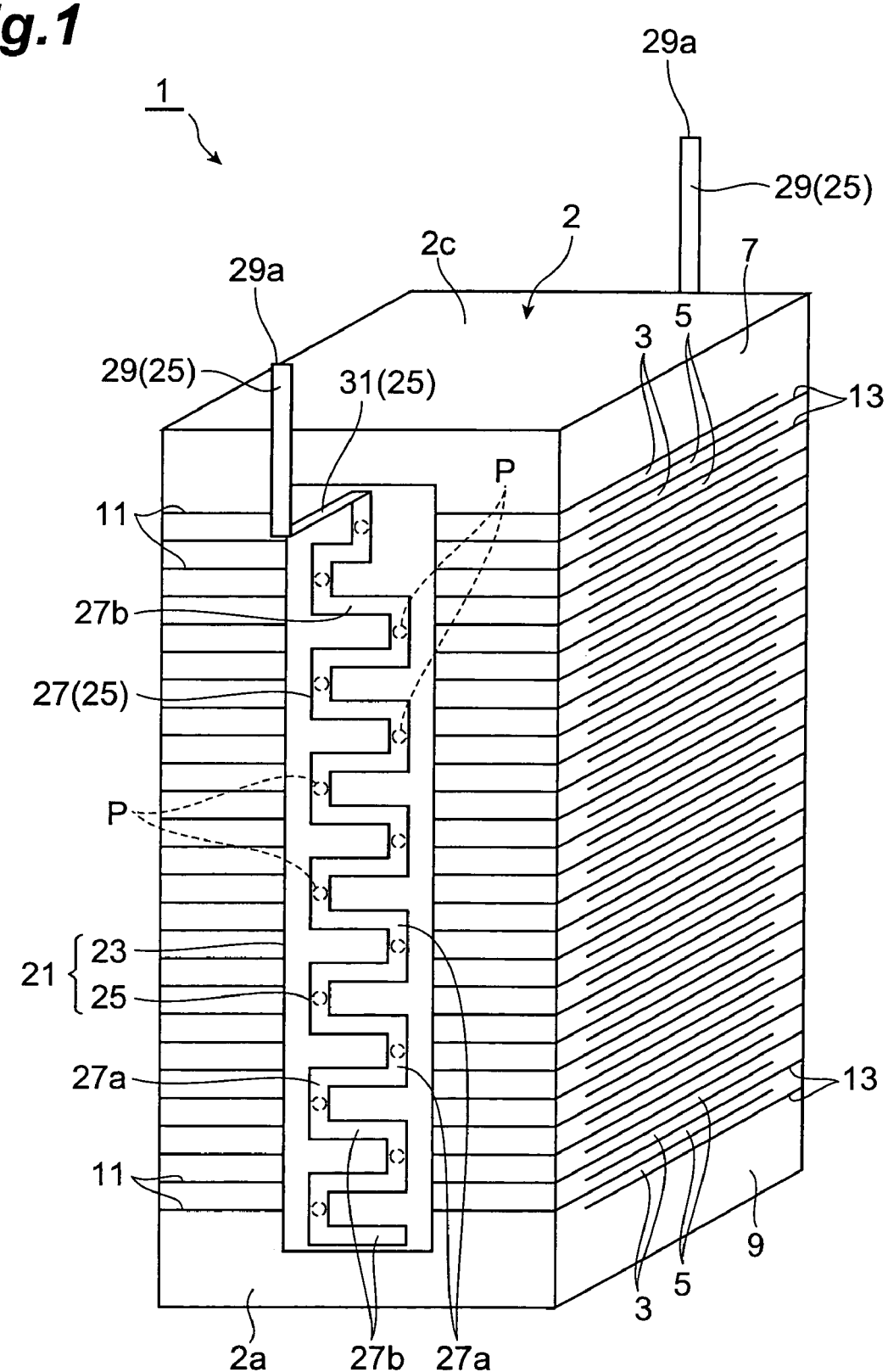
FIG. 1 is a perspective view of an embodiment of the multilayer piezoelectric device according to the present invention.

The preferred embodiment of the multilayer piezoelectric device according to the present invention will be described below in detail with reference to the drawings. Identical or equivalent portions will be denoted by the same reference symbols throughout the drawings, without redundant description. In the present specification, the terms "up," "down," etc. are based on the states shown in the drawings and used for descriptive purposes.

Figure 2:
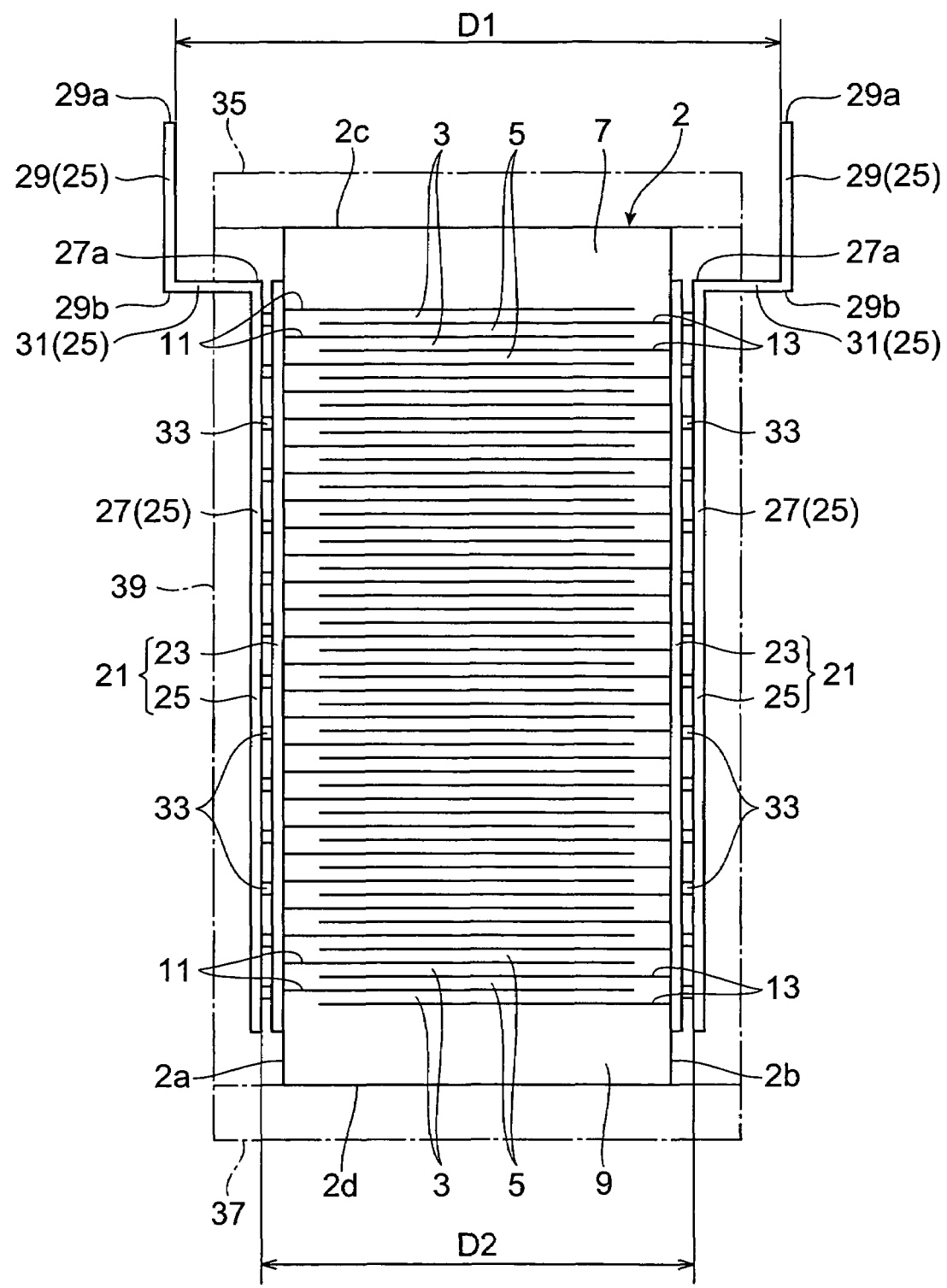
FIG. 2 is a schematic diagram for explaining a sectional configuration of the multilayer piezoelectric device shown in FIG. 1.

As shown in FIGS. 1 and 2, a multilayer piezoelectric device 1 has a laminate 2 of polygonal prism shape (quadrangular prism shape herein). The laminate 2 has first side face 2a and second side face 2b located in parallel with a stack direction of the laminate 2 (hereinafter referred to simply as "stack direction") and opposite to each other.

The laminate 2 is constructed of an alternate stack of piezoelectric members 3 and piezoelectric members 5 which are sandwiched between a piezoelectric member 7 and a piezoelectric member 9 up and down. Each of the piezoelectric members 3, 5, 7, and 9 is made of a piezoelectric ceramic material, for example, consisting primarily of lead zirconate titanate and formed in a rectangular thin plate shape. The thickness of each piezoelectric member 3, 5 herein is 50-100 µm.

The laminate 2 has first internal electrodes 11 and second internal electrodes 13. Each first internal electrode 11 is formed on an upper surface of piezoelectric member 3, and each second internal electrode 13 on an upper surface of piezoelectric member 5, 9. Each of the internal electrodes 11, 13 is made of an electroconductive material consisting primarily of silver and palladium, for example, and is formed in a pattern by screen printing. The thickness of each internal electrode 11, 13 herein is 0.5-5 µm.

In the laminate 2, the first internal electrodes 11 and second internal electrodes 13 are stacked with the piezoelectric member 3, 5 in between. This results in forming the laminate 2 in which a plurality of piezoelectric members 3, 5 and a plurality of internal electrodes 11, 13 are alternately stacked.

The first internal electrodes 11 are formed so as to start from a point inside the second side face 2b and to be exposed in the first side face 2a. Namely, the ends of the first internal electrodes 11 on the second side face 2b side are located a predetermined distance apart from the second side face 2b. The first internal electrodes 11 are not exposed in the second side face 2b.

The second internal electrodes 13 are formed so as to start from a point inside the first side face 2a and to be exposed in the second side face 2b. Namely, the ends of the second internal electrodes 13 on the first side face 2a side are located a predetermined distance apart from the first side face 2a. The second internal electrodes 13 are not exposed in the first side face 2a. When viewed from the stack direction, the second internal electrodes 13 are located so that a part thereof overlaps a part of the first internal electrodes 11.

An external electrode 21 is provided on each of the side faces 2a, 2b of the laminate 2. Each external electrode 21 is composed of a first external electrode 23 and a second external electrode 25. The first external electrode 23 is formed so as to cover a part of each side face 2a, 2b. The first external electrode 23 is made, for example, of an electroconductive material consisting primarily of silver and formed in a pattern by screen printing. The thickness of the first external electrode 23 herein is 1-40 μm.

The first external electrode 23 formed on the first side face 2a is electrically connected to the first internal electrodes 11 exposed in the first side face 2a, on the first side face 2a. The first external electrode 23 formed on the second side face 2b are electrically connected to the second internal electrodes 13 exposed in the second side face 2b, on the second side face 2b.

The second external electrode 25 is integrally formed of a main body part 27 arranged to overlap the first external electrode 23, an extending part 29 arranged apart from the first external electrode 23 when compared with the main body part 27, and above the main body part 27, and a connection part 31 connecting the main body part 27 to the extending part 29, and is located outside each first external electrode 23. As arranged in this manner, between second external electrodes 25 facing each other, a distance D1 between extending parts 29 is larger than a distance D2 between main body parts 27.

The second external electrode 25 is made, for example, of one selected from copper and alloys thereof, nickel and alloys thereof, electroconductive materials such as stainless steel or beryllium copper, and members with a film plated on a surface of the electroconductive materials, and is constructed by bending a member of flat plate shape so that the extending part 29 and connection part 31 are formed in a cranked shape relative to the main body part 27. The thickness of the second external electrode 25 herein is approximately 150 μm. By simply bending the member of flat plate shape in this manner, it is feasible to integrally form the second external electrode 25 having the main body part 27, extending part 29, and connection part 31 without difficulty.

The main body part 27 has first portions 27a and second portions 27b. The first portions 27a extend along the stack direction and are discontinuously arranged in the stack direction. The second portions 27b extend along a direction intersecting with the stack direction (the direction perpendicular to the stack direction herein) and connect the first portions 27a to each other. In this configuration the main body part 27 is arranged to extend in a rectangular wave shape (i.e., a pulse wave shape) along the stack direction as a whole.

The main body part 27 is electrically and physically (i.e., mechanically) connected to the first external electrode 23 in a discontinuous manner by solder 33 at connections P located on the respective first portions 27a. The diameter of solder 33 herein is approximately 200 μm. The first external electrode 23 and the main body part 27 may be connected by spot welding or with an electroconductive adhesive at each connection P. The first external electrode 23 and main body part 27 may be electrically and physically connected in a discontinuous manner at connections P located on the respective second portions 27b.

The extending part 29 linearly extends along the stack direction and has an upper end (one end) 29a projecting with respect to an upper face (one end face) 2c of the laminate 2 in the stack direction. Namely, the upper end 29a of the extending part 29 is located above the upper face 2c of the laminate 2 in the stack direction. An upper end 27a of the main body part 27 and a lower end 29b of the extending part 29 are located below the upper face 2c of the laminate 2 in the stack direction, and the upper end 27a of the main body part 27 and the lower end 29b of the extending part 29 are connected by connection part 31 linearly extending along a direction intersecting with the stack direction (the direction perpendicular to the stack direction herein).

In the multilayer piezoelectric device 1 constructed as described above, using the extending parts 29 of the pair of second external electrodes 25 as terminals, a voltage is applied between the first external electrode 23 formed on the first side face 2a and the first external electrode 23 formed on the second side face 2b, whereupon the voltage is applied between the first internal electrodes 11 and the second internal electrodes 13. This results in producing electric fields in portions of the piezoelectric members 3, 5 between the first internal electrodes 11 and the second internal electrodes 13, so that those portions become displaced as active parts. The multilayer piezoelectric device 1 of this type is suitably applicable, particularly, to those for control of fuel injection.

Incidentally, the multilayer piezoelectric device 1 is constructed so that the main body part 27 of the second external electrode 25 extends in the rectangular wave shape along the stack direction and is electrically and physically connected to the first external electrode 23 at multiple connections P. This imparts flexibility in the stack direction to the main body part 27, which can suppress inhibition of the displacement in the stack direction of the laminate 2 and which can suppress breakage of the main body part 27 even in long-term use of the piezoelectric device 1. The main body part 27 does not have to be limited to the rectangular wave shape, but may be formed in any wave shape along the stack direction (e.g., a triangular wave shape, a sine wave shape, or the like), with flexibility in the stack direction.

Furthermore, even in the event of breakage of the first external electrode 23 formed on each side face 2a, 2b of the laminate 2, the main body part 27 of the second external electrode 25 still remains electrically and physically connected to the first external electrode 23 at multiple connections P, and thus electric paths are secured to the first internal electrodes 11 and to the second internal electrodes 13, without damage to the function of the piezoelectric device 1.

Next, a production method of multilayer piezoelectric device 1 will be described.

First, an organic binder, an organic solvent, etc. are mixed in a piezoelectric ceramic material consisting primarily of lead zirconate titanate, to prepare a substrate paste, and the substrate paste is used to form green sheets for the respective piezoelectric layers 3, 5, 7, 9. Furthermore, an organic binder, an organic solvent, etc. are mixed in a metal material consisting of silver and palladium at a predetermined ratio (e.g., silver:palladium=7:3), to prepare an electroconductive paste for formation of electrode patterns.

Subsequently, an electrode pattern corresponding to the first internal electrode 11 is formed on each of green sheets.

An electrode pattern corresponding to the second internal electrode 13 is formed on each of other green sheets. The formation of each electrode pattern is performed by screen printing using the aforementioned electroconductive paste.

Subsequently, the green sheets with the electrode pattern corresponding to the first internal electrode 11 and the green sheets with the electrode pattern corresponding to the second internal electrode 13 are alternately stacked, and green sheets without any electrode pattern are further stacked as outermost layers, thereby preparing a green laminate. The number of green sheets stacked herein is about 350.

Subsequently, while heating the green laminate at a predetermined temperature (e.g., about 60° C.), it is pressed under a predetermine pressure (e.g., about 100 MPa) in the stack direction, and thereafter the green laminate is cut in a predetermined size. The cutting of the green laminate is carried out, for example, by means of a diamond blade. This makes the first internal electrodes 11 exposed in the first side face 2a and the second internal electrodes 13 exposed in the second side face 2b.

Subsequently, the green laminate is degreased (i.e., debindered) at a predetermined temperature (e.g., about 400° C.), and thereafter it is baked at a predetermined temperature (e.g., about 1100° C.) for a predetermined time (e.g., about two hours), thereby obtaining the laminate 2.

Subsequently, screen printing with an electroconductive paste consisting primarily of silver is performed on each of side faces 2a, 2b of the laminate 2, and thereafter the laminate is baked at a predetermined temperature (e.g., about 700° C.) to form the first external electrodes 23. Sputtering, electroless plating, or the like may also be applied to the formation of the first external electrodes 23.

Subsequently, the second external electrodes 25 prepared separately are connected to the first external electrodes 23 at each of connections P by soldering. The second external electrodes 25 are prepared, for example, by tin-plating a plate material of stainless steel, a nickel alloy, or the like and thereafter processing the plate material in the shape as described above.

Finally, a polarization process (e.g., application of an electric field at the intensity of 2 kV/mm in an environment of temperature of 120° C. for three minutes) is carried out to obtain the multilayer piezoelectric device 1.

In the multilayer piezoelectric device 1, as described above, the second external electrode 25 is integrally formed including the main body part 27 electrically and physically connected to the first external electrode 23, and the extending part 29 having the upper end 29a projecting with respect to the upper face 2c of laminate 2 in the stack direction. This allows the extending part 29 of the second external electrode 25 to be used as a terminal. Since the second external electrode 25 is integrally formed, the second external electrode 25 can be prevented from breaking even in long-term use of the piezoelectric device 1. Accordingly, the reliability of piezoelectric device 1 is enhanced.

Since the main body part 27 electrically and physically connected to the first external electrode 23, and the extending part 29 applicable as a terminal are integrally formed through the connection part 31, the number of parts can be reduced, as compared with a configuration wherein a lead pin or the like is electrically connected as a terminal to the second external electrode. In addition, the present invention eliminates the need for positioning for electrically connecting the lead pin or the like as a terminal to the second external electrode.

The multilayer piezoelectric device 1 is formed in a unit in the following manner, in order to exert a preload on the laminate 2 when incorporated into various devices such as fuel injectors. Namely, as shown in FIG. 2, a head plate 35 of metal is placed on the upper face 2c of the laminate 2, and a bottom plate 37 of metal on the lower face 2d of the laminate 2. The head plate 35 and the bottom plate 37 are coupled to each other by a coupling member 39 of cylindrical shape to exert a compressive force in the stack direction. In this unit formation of multilayer piezoelectric device 1, since between the opposed second external electrodes 25 the distance D1 between the extending parts 29 is larger than the distance D2 between the main body parts 27, the extending parts 29 are prevented from becoming a hindrance on the occasion of placing the head plate 35 on the upper face 2c of the laminate 2, and this facilitates the unit formation of the piezoelectric device 1 when incorporated into various devices.

In addition, the upper end 27a of the main body part 27 and the lower end 29b of the extending part 29 are located below the upper face 2c of the laminate 2 in the stack direction, and the upper end 27a of the main body part 27 and the lower end 29b of the extending part 29 are connected by the connection part 31 linearly extending along the direction intersecting with the stack direction. For this reason, a short circuit can be prevented between the head plate 35 located on the upper face 2c of the laminate 2, and the second external electrode 25 during formation of the unit of the multilayer piezoelectric device 1 as described above.

The present invention is by no means limited to the above-described embodiment.

For example, the shape of laminate 2 is not limited to the polygonal prism shape, but may be a cylindrical column shape. In a case where the laminate 2 is of cylindrical column shape, the external electrodes 21 may be provided in any regions on the side face as long as they are located opposite to each other.

The first internal electrodes 11 may be exposed in the second side face 2b if they are electrically isolated from the external electrode 21 provided on the second side face 2b. Likewise, the second internal electrodes 13 may be exposed in the first side face 2a if they are electrically isolated from the external electrode 21 provided on the first side face 2a.

The second external electrode 25 had the main body part 27 and the extending part 29 made by bending the member of flat plate shape into the cranked shape, but it may be constructed to have the main body part 27 and extending part 29 made by curving the member of flat plate shape.

The extending part 29 of the second external electrode 25 may be provided with a connector as a terminal.

The multilayer piezoelectric device according to the present invention has high reliability and facilitates formation of a unit when incorporated into various devices.

What is claimed is:

1. A multilayer piezoelectric device comprising:
   a laminate consisting of an alternate stack of a plurality of piezoelectric members and a plurality of internal electrodes;
   first external electrodes which are provided on side faces of the laminate so as to face each other, and each of which is electrically connected to predetermined ones of said internal electrodes; and
   second external electrodes provided outside the respective first external electrodes,
   wherein each of the second external electrodes is integrally formed including a main body part electrically and physically connected to the corresponding first external electrode, and an extending part having one end projecting with respect to one end face of the laminate in a stack direction of the laminate, and
   wherein, between the second external electrodes facing each other, a distance between the extending parts is larger than a distance between the main body parts.

* * * * *